United States Patent
Wang et al.

(10) Patent No.: US 9,559,032 B2
(45) Date of Patent: Jan. 31, 2017

(54) METHOD FOR FORMING MOS DEVICE PASSIVATION LAYER AND MOS DEVICE

(71) Applicant: CSMC Technologies FAB2 CO., Ltd., Wuxi New District (CN)

(72) Inventors: Zhewei Wang, Wuxi New District (CN); Xuelei Chen, Wuxi New District (CN); Binbin Liu, Wuxi New District (CN); Liuchun Gao, Wuxi New District (CN); Hongxing Zhao, Wuxi New District (CN); Guomin Huang, Wuxi New District (CN); Long Jiang, Wuxi New District (CN); Jibin Jiao, Wuxi New District (CN)

(73) Assignee: CSMC Technologies Fab2 Co., Ltd., Wuxi New District, Jiangsu (XN)

( * ) Notice: Subject to any disclaimer, the term of this patent is extended or adjusted under 35 U.S.C. 154(b) by 0 days.

(21) Appl. No.: 14/412,445

(22) PCT Filed: Jul. 25, 2013

(86) PCT No.: PCT/CN2013/080149
§ 371 (c)(1),
(2) Date: Sep. 9, 2015

(87) PCT Pub. No.: WO2014/015820
PCT Pub. Date: Jan. 30, 2014

(65) Prior Publication Data
US 2015/0364397 A1    Dec. 17, 2015

(30) Foreign Application Priority Data

Jul. 26, 2012    (CN) .......................... 2012 1 0260811

(51) Int. Cl.
*H01L 23/31*    (2006.01)
*H01L 21/02*    (2006.01)
(Continued)

(52) U.S. Cl.
CPC ....... *H01L 23/3171* (2013.01); *H01L 21/0214* (2013.01); *H01L 21/0217* (2013.01);
(Continued)

(58) Field of Classification Search
CPC ............. H01L 23/3171; H01L 21/0217; H01L 21/0214; H01L 29/78; H01L 21/02129; H01L 29/66568; H01L 21/76829; H01L 21/02126; H01L 23/291; H01L 21/02271; H01L 23/3192
See application file for complete search history.

(56) References Cited

U.S. PATENT DOCUMENTS 5,070,386 A     12/1991   Imura
5,334,554 A *   8/1994    Lin .................. H01L 21/76801
                                                     204/192.22

(Continued)

OTHER PUBLICATIONS

Extended European Search Report for application No. 138222245, dated Feb. 1, 2016 (6 pages).

*Primary Examiner* — William Coleman
(74) *Attorney, Agent, or Firm* — Hamre, Schumann, Mueller & Larson, P.C.

(57) ABSTRACT

The present invention provides a method of forming a passivation layer of a MOS device, and a MOS device. The method of forming a passivation layer of a MOS device includes: forming a substrate; forming a dielectric on the substrate; patterning the dielectric to expose a part of the substrate; forming a metal on the exposed part of the substrate, and the dielectric; forming a TEOS on the metal; forming a PSG on the TEOS; and forming a silicon nitrogen compound on the PSG. Therefore, the cracks problem of the passivation can be alleviated.

10 Claims, 3 Drawing Sheets

(51) Int. Cl.

| | |
|---|---|
| *H01L 23/29* | (2006.01) |
| *H01L 29/66* | (2006.01) |
| *H01L 29/78* | (2006.01) |
| H01L 23/532 | (2006.01) |

(52) U.S. Cl.
CPC .. *H01L 21/02126* (2013.01); *H01L 21/02129* (2013.01); *H01L 21/02271* (2013.01); *H01L 23/291* (2013.01); *H01L 23/3192* (2013.01); *H01L 29/66568* (2013.01); *H01L 29/66674* (2013.01); *H01L 29/78* (2013.01); *H01L 29/7801* (2013.01); H01L 23/53295 (2013.01); H01L 2924/0002 (2013.01)

(56) References Cited

U.S. PATENT DOCUMENTS

| | | | | |
|---|---|---|---|---|
| 5,627,403 | A * | 5/1997 | Bacchetta | H01L 21/02129 257/639 |
| 6,025,279 | A * | 2/2000 | Chiang | H01L 21/31053 257/E21.244 |
| 6,127,261 | A * | 10/2000 | Ngo | H01L 21/76801 257/E21.576 |
| 6,300,252 | B1 * | 10/2001 | Ying | H01L 21/31116 216/67 |
| 6,709,930 | B2 * | 3/2004 | Chan | H01L 29/0634 257/E29.04 |
| 9,076,798 | B2 * | 7/2015 | Chen | H01L 21/78 |
| 2003/0173670 | A1 | 9/2003 | Chiu et al. | |
| 2006/0081965 | A1 * | 4/2006 | Ruan | H01L 21/3105 257/632 |

* cited by examiner

METHOD FOR FORMING MOS DEVICE PASSIVATION LAYER AND MOS DEVICE

BACKGROUND

As shown in FIG. 1, structure of a prior art DMOS (Double-diffusion Metal Oxide Semiconductor) product are shown. The DMOS product includes a substrate 1, a dielectric 2, a metal 3, and a passivation layer 4. Wherein, the passivation layer 4 is a silicon nitride layer with a thickness about 10000 angstroms.

Generally, a high voltage DMOS product is required to undergo a HTRB (High Temperature Reverse Bias) test and HTGB (High Temperature Gate Bias) test. The DMOS product needs to meet different requirements according to different applications. Some low-end products merely need to pass a 168 hours test, but some high-end products are required to pass a 1000 hours test. It can be found that in actual production, when many products undergo a test of more than 500 hours, a large amount of aluminum is corroded after the product being soaked in a hydrochloric acid (i.e. pinhole test), and the passivation layer 4 has cracks thereon, such that an electric leakage can easily occurs.

SUMMARY

In view of this, the present invention provides a new method of forming a passivation layer of a MOS device and a MOS device, to alleviate the cracking problem.

The present invention provides a method of forming a passivation layer of a MOS device, the method includes:
 forming a substrate;
 forming a dielectric on the substrate;
 patterning the dielectric to expose a part of the substrate;
 forming a metal on the exposed part of the substrate, and the dielectric;
 forming a TEOS on the metal;
 forming a PSG on the TEOS; and
 forming a silicon nitrogen compound on the PSG.

Preferably, in above-described method of the present invention, a thickness of the TEOS is in a range from 9000 to 11000 angstroms, a thickness of the PSG is in a range from 2700 to 3300 angstroms, the silicon nitrogen compound can be SiON, and a thickness of the SiON is in a range from 2700 to 3300 angstroms, additionally, the silicon nitrogen compound can also be SiN.

Preferably, in above-described method of the present invention, the thickness of the TEOS is 10000 angstroms, the thickness of the PSG is 3000 angstroms, and the thickness of the SiON is 3000 angstroms.

Preferably, in above-described method of the present invention, the TEOS, the PSG, the SiON or the TEOS, the PSG, the SiN are formed by a chemical vapor deposition method.

Preferably, in above-described method of the present invention, the MOS device is a CMOS device or a DMOS device.

The present invention further provides a MOS device, the MOS device includes:
 a substrate;
 a dielectric formed on a part of the substrate;
 a metal formed on the substrate and the dielectric; and
 a passivation layer formed on the metal, including:
 a TEOS formed on the metal;
 a PSG formed on the TEOS; and
 a silicon nitrogen compound formed on the PSG.

Preferably, in above-described MOS device of the present invention, a thickness of the TEOS is in a range from 9000 to 11000 angstroms, a thickness of the PSG is in a range from 2700 to 3300 angstroms, the silicon nitrogen compound can be SiON, and a thickness of the SiON is in a range from 2700 to 3300 angstroms, the silicon nitrogen compound also can be SiN.

Preferably, in above-described MOS device of the present invention, the thickness of the TEOS is 10000 angstroms, the thickness of the PSG is 3000 angstroms, and the thickness of the SiON is 3000 angstroms.

Preferably, in above-described MOS device of the present invention, the TEOS, the PSG, the SiON or the TEOS, the PSG, the SiN are formed by a chemical vapor deposition method.

Preferably, in above-described MOS device of the present invention, the MOS device is a CMOS device or a DMOS device.

In the present invention, as the TEOS and the PSG on the bottom can efficiently relief a stress of the top layers, and at the same time, a stress of the silicon nitrogen compound is relative less than that of original, thereby efficiently improving the cracks problems of the passivation layer.

In the present invention, a condemnation factor of the product can be efficiently reduced, thereby enhancing a generating efficiency thereof.

DETAILED DESCRIPTION

The following clearly describes the preferred embodiments of the present invention with reference to the accompanying drawings. The use of the same reference numbers in different instances in the figures indicate identical elements.

Figure 1:
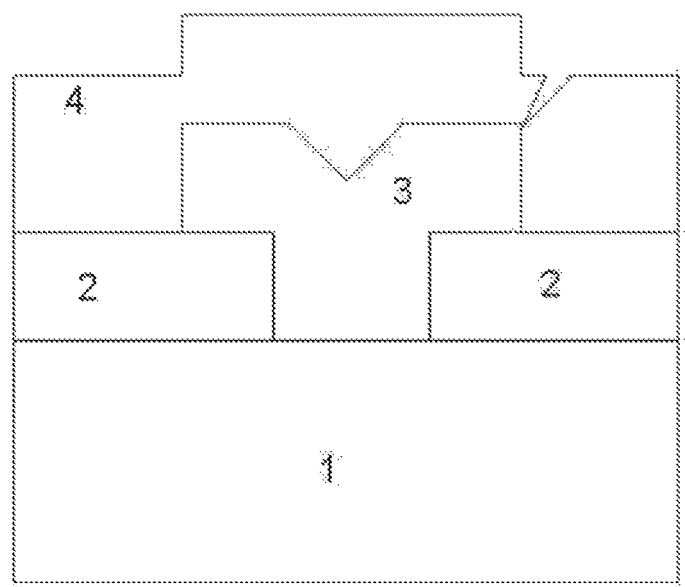
FIG. 1 is a schematic view of structure of a DMOS product in accordance with prior art.
Figure 2:
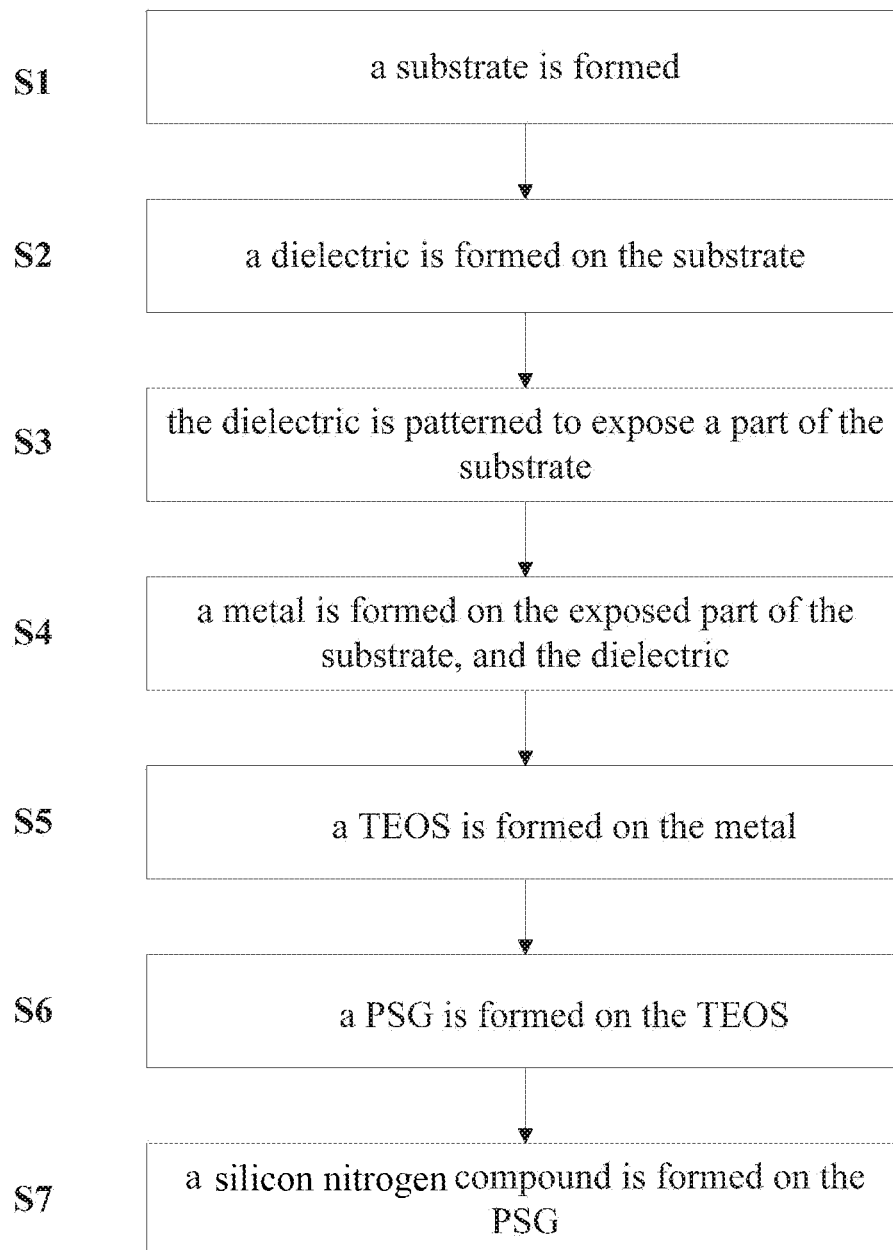
FIG. 2 is a flow chart of a method for forming of a MOS device passivation layer according to an exemplary embodiment of the present invention.

FIG. 2 is a flow chart of a method of forming a passivation layer of a MOS device a according to an exemplary embodiment of the present invention. As shown in the figure, the method includes steps as follows:

S1, a substrate is formed. The substrate can be a monocrystalline silicon with a crystal orientation of <100> and a resistance of 15~25 ohms.

S2, a dielectric is formed on the substrate. The dielectric can be oxide layer, for example, an oxide silicon layer.

S3, the dielectric is patterned to expose a part of the substrate.

S4, a metal is formed on the exposed part of the substrate, and the dielectric. The metal can be aluminum, for example.

S5, a TEOS (tetraethyl orthosilicate) is formed on the metal. Preferably, the thickness of the TEOS is 9000 to 11000 angstroms, and more preferably, the thickness of the TEOS is 10000 angstroms.

S6, a PSG (phosphosilicate glass) is formed on the TEOS. Preferably, the thickness of the PSG is 2700 to 3300 angstroms, and more preferably, the thickness of the PSG is 3000 angstroms.

S7, a silicon nitrogen compound is formed on the PSG. Preferably, the thickness of the silicon nitrogen compound (SiON) is 2700 to 3300 angstroms, and more preferably, the thickness of the silicon nitrogen compound (SiON) is 3000 angstroms. In addition, the SiON can be substituted by SiN.

Preferably, the TEOS, the PSG, and the SiON are formed by a chemical vapor deposition method.

Preferably, above-described MOS device is a CMOS (Complementary Metal Oxide Semiconductor) device or a DMOS device.

Figure 3:
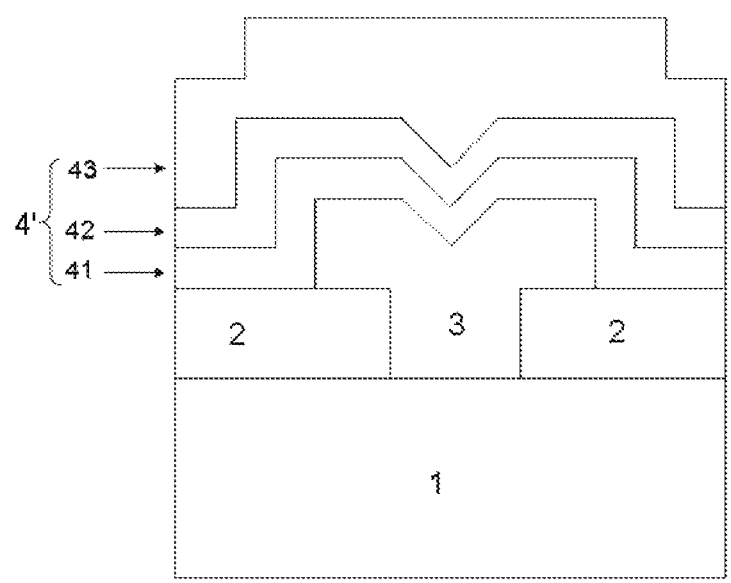
FIG. 3 is a schematic view of structure of the MOS device according to an exemplary embodiment of the present invention.

FIG. 3 is a schematic view of structure of the MOS device according to an embodiment of the present invention. The silicon nitrogen compound in the process of forming the passivation layer can be SiON or SiN and so on. SiON is illustrated as a silicon nitrogen compound in the following embodiment for example, as shown in the figure, the MOS device includes a substrate 1, a dielectric 2 formed on a part of the substrate 1, a metal 3 formed on the substrate 1 and the dielectric 2, and a passivation layer 4' formed on the metal 3. The passivation layer 4' includes:

a TEOS 41 formed on the metal 3;
a PSG 42 formed on the TEOS 41; and
a SiON 43 formed on the PSG 42.

Preferably, the thickness of the TEOS 41 is 9000 to 11000 angstroms, the thickness of the PSG 42 is 2700 to 3300 angstroms, and the thickness of the SiON 43 is 2700 to 3000 angstroms.

More preferably, the thickness of the TEOS 41 is 10000 angstroms, the thickness of the PSG 42 is 3000 angstroms, and the thickness of the SiON 43 is 3000 angstroms.

Preferably, the TEOS 41, the PSG 42, and the SiON 43 are formed by a chemical vapor deposition method.

Preferably, above-described MOS device is a CMOS device or a DMOS device.

In view of these teachings, a technical person skilled in the art can readily envisage of other embodiments of the present invention, combinations and modifications. Accordingly, when reading combined with the foregoing description and accompanying drawings, the present invention is only defined by the claims.

What is claimed is:

1. A method of forming a metal oxide semiconductor (MOS) device, comprising:
   forming a dielectric on a substrate;
   patterning the dielectric to expose a part of the substrate;
   forming a metal on the exposed part of the substrate and the dielectric;
   forming the passivation layer on the MOS device, forming the passivation layer including:
   forming a tetraethyl orthosilicate (TEOS), a phosphosilicate glass (PSG), and a silicon nitrogen compound on the metal in this order.

2. The method according to claim 1, wherein a thickness of the TEOS is in a range of from 9000 to 11000 angstroms, a thickness of the PSG is in a range from 2700 to 3300 angstroms, the silicon nitrogen compound is SiON or SiN, and a thickness of the SiON is in a range from 2700 to 3300 angstroms.

3. The method according to claim 1, wherein the MOS device is a complementary MOS (CMOS) device or a double-diffusion (DMOS) device.

4. The method according to claim 2, wherein the thickness of the TEOS is 10000 angstroms, the thickness of the PSG is 3000 angstroms, and the thickness of the SiON is 3000 angstroms.

5. The method according to claim 2, wherein the TEOS, the PSG, and the SiON or the TEOS, the PSG, and the SiN are formed by a chemical vapor deposition method.

6. A metal oxide semiconductor (MOS) device, comprising:
   a substrate;
   a dielectric formed on a part of the substrate;
   a metal formed on the substrate and the dielectric; and
   a passivation layer formed on the metal, comprising:
   in order, a first layer including a tetraethyl orthosilicate (TEOS);
   a second layer including a phosphosilicate glass (PSG); and
   a third layer including a silicon nitrogen compound.

7. The MOS device according to claim 6, wherein a thickness of the TEOS is in a range from 9000 to 11000 angstroms, a thickness of the PSG is in a range from 2700 to 3300 angstroms, the silicon nitrogen compound is SiON or SiN, and a thickness of the SiON is in a range from 2700 to 3300 angstroms.

8. The MOS device according to claim 6, wherein the MOS device is a complementary MOS (CMOS) device or a double-diffusion (DMOS) device.

9. The MOS device according to claim 7, wherein the thickness of the TEOS is 10000 angstroms, the thickness of the PSG is 3000 angstroms, and the thickness of the SiON is 3000 angstroms.

10. The MOS device according to claim 7, wherein the TEOS, the PSG, and the SiON or the TEOS, the PSG, and the SiN are formed by a chemical vapor deposition method.

* * * * *